US010134929B2

(12) United States Patent
Gershon et al.

(10) Patent No.: US 10,134,929 B2
(45) Date of Patent: Nov. 20, 2018

(54) ACHIEVING BAND GAP GRADING OF CZTS AND CZTSE MATERIALS

(71) Applicant: International Business Machines Corporation, Armonk, NY (US)

(72) Inventors: Talia S. Gershon, White Plains, NY (US); Richard A. Haight, Mahopac, NY (US); Marinus Hopstaken, Carmel, NY (US); Yun Seog Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/883,300

(22) Filed: Oct. 14, 2015

(65) Prior Publication Data
US 2017/0110606 A1   Apr. 20, 2017

(51) Int. Cl.
| | | |
|---|---|---|
| *H01L 31/032* | (2006.01) | |
| *H01L 21/02* | (2006.01) | |
| *H01L 31/18* | (2006.01) | |
| *H01L 31/072* | (2012.01) | |
| *H01L 31/065* | (2012.01) | |
| *H01L 31/0392* | (2006.01) | |

(52) U.S. Cl.
CPC ...... *H01L 31/0326* (2013.01); *H01L 21/0245* (2013.01); *H01L 21/0251* (2013.01); *H01L 21/0256* (2013.01); *H01L 21/02381* (2013.01); *H01L 21/02474* (2013.01); *H01L 21/02477* (2013.01); *H01L 21/02485* (2013.01); *H01L 21/02557* (2013.01); *H01L 21/02568* (2013.01); *H01L 21/02573* (2013.01); *H01L 21/02664* (2013.01); *H01L 31/0392* (2013.01); *H01L 31/065* (2013.01); *H01L 31/072* (2013.01); *H01L 31/1864* (2013.01); *H01L 31/1892* (2013.01); *Y02E 10/50* (2013.01)

(58) Field of Classification Search
CPC ............ H01L 31/0326; H01L 31/0327; H01L 31/0322; H01L 31/0323; H01L 31/0749; H01L 31/1864; H01L 31/1872
See application file for complete search history.

(56) References Cited

U.S. PATENT DOCUMENTS

| | | |
|---|---|---|
| 7,589,003 B2 | 9/2009 | Kouvetakis et al. |
| 2011/0294254 A1 | 12/2011 | Jackrel et al. |

(Continued)

OTHER PUBLICATIONS

Shu et al., "Cu2Zn(Sn,Ge)Se4 and Cu2Zn(Sn,Si)Se4 alloys as photovoltaic materials: Structural and electronic properties," Physical Review B 87, 115208-1-6 (Mar. 2013).

(Continued)

*Primary Examiner* — Eric R Smith
(74) *Attorney, Agent, or Firm* — Vazken Alexanian; Michael J. Chang, LLC

(57) ABSTRACT

Techniques for achieving band gap grading in CZTS/Se absorber materials are provided. In one aspect, a method for creating band gap grading in a CZTS/Se absorber layer includes the steps of: providing a reservoir material containing Si or Ge; forming the CZTS/Se absorber layer on the reservoir material; and annealing the reservoir material and the CZTS/Se absorber layer under conditions sufficient to diffuse Si or Ge atoms from the reservoir material into the CZTS/Se absorber layer with a concentration gradient to create band gap grading in the CZTS/Se absorber layer. A photovoltaic device and method of forming the photovoltaic device are also provided.

19 Claims, 5 Drawing Sheets

(56) References Cited

U.S. PATENT DOCUMENTS

| | | | |
|---|---|---|---|
| 2012/0055554 A1* | 3/2012 | Radu | B82Y 30/00 |
| | | | 136/264 |
| 2013/0037090 A1 | 2/2013 | Bag et al. | |
| 2013/0164918 A1 | 6/2013 | Liang et al. | |
| 2013/0213478 A1* | 8/2013 | Munteanu | H01L 21/2254 |
| | | | 136/264 |
| 2013/0217177 A1 | 8/2013 | Wong et al. | |
| 2014/0113403 A1 | 4/2014 | Van Duren et al. | |
| 2014/0182665 A1 | 7/2014 | Liang | |
| 2014/0264708 A1* | 9/2014 | Van Duren | H01L 31/18 |
| | | | 257/458 |

OTHER PUBLICATIONS

Shin et al., "Epitaxial growth of kesterite Cu2ZnSnS4 on a Si(001) substrate by thermal coevaporation," Thin Solid Films, vol. 556, pp. 9-12 (Apr. 2014).

Rockett "The effect of Na in polycrystalline and epitaxial single-crystal CuIn1-XGaXSe2," Thin Solid Films 480-481, pp. 2-7 (2005) (published Dec. 2004).

Dullweber et al., "A new approach to high-efficiency solar cells by band gap grading in Cu(In,Ga)Se2 chalcopyrite semiconductors," Solar Energy Materials & Solar Cells 67 (Mar. 2001) pp. 145-150.

Guo et al., "Enhancing the performance of CZTSSe solar cells with Ge alloying," Solar Energy Materials & Solar Cells 105 (Oct. 2012) pp. 132-136.

Bag et al., "Hydrazine-Processed Ge-Substituted CZTSe Solar Cells," Chem. Mater. 24(23) pp. 4588-4593 (Nov. 2012).

S. Chen et al., "Compositional dependence of structural and electronic properties of Cu2ZnSn(S, Se)4 alloys for thin film solar cells," Physical Review B, vol. 83, No. 12, Mar. 2011, 125201, 5 pages.

M. Hamdi et al., "Crystal chemistry and optical investigations of the Cu2Zn(Sn,Si)S4 series for photovoltaic applications," Journal of Solid State Chemistry, vol. 220, Sep. 2014, pp. 232-237.

* cited by examiner

US 10,134,929 B2

ACHIEVING BAND GAP GRADING OF CZTS AND CZTSE MATERIALS

STATEMENT OF GOVERNMENT RIGHTS

This invention was made with Government support under Contract number DE-EE0006334 awarded by The Department of Energy. The Government has certain rights in this invention.

FIELD OF THE INVENTION

The present invention relates to absorber materials containing copper (Cu), zinc (Zn), tin (Sn) and at least one of sulfur (S) and selenium (Se) (i.e., CZTS/Se materials), and more particularly, to techniques for achieving band gap grading in CZTS/Se absorber materials using diffusion of silicon (Si) or germanium (Ge) atoms from a reservoir material.

BACKGROUND OF THE INVENTION

Solar cell performance often benefits from the ability to form a band gap gradient in the absorber material. Efficiencies typically improve as the band gap increases towards the "back" of the absorber (away from the junction), and/or there is a slight bandgap increase near the junction. High-efficiency $Cu(In,Ga)Se_2$ devices, for example, use a multi-stage co-evaporation process, in part to achieve this desired compositional gradient.

The $Cu_2ZnSn(S,Se)_4$ system would similarly benefit from the ability to form a graded-band gap absorber. The ratio of sulfur to selenium determines the band gap of CZTSSe. However, it is very difficult to form a S/Se gradient due to the fact that these species readily inter-mix at elevated temperatures.

An additional method of changing the band gap is to replace Cu, Zn, or Sn atoms with iso-valent species having different atomic/ionic radii. For example, it has been shown that introducing Ge as a replacement for a Sn atom increases the band gap. See, for example, Shu et al., "$Cu_2Zn(Sn,Ge)Se_4$ and $Cu_2Zn(Sn,Si)Se_4$ alloys as photovoltaic materials: Structural and electronic properties," Physical Review B 87, 115208-1-6 (March 2013). This bulk effect has been demonstrated with nanocrystalline inks, however a band gap gradient has not been demonstrated. $Cu_2ZnSiS_4$ is also known to have a very wide band gap (i.e., about 3 electron-volts (eV)), therefore replacement of Sn with Si is expected to increase the band gap of CZTS(e).

Thus, improved techniques for achieving band gap grading in solar absorber materials would be desirable.

SUMMARY OF THE INVENTION

The present invention provides techniques for achieving band gap grading in CZTS/Se absorber materials using diffusion of silicon (Si) or germanium (Ge) atoms from a reservoir material. In one aspect of the invention, a method for creating band gap grading in an absorber layer is provided. The method includes the steps of: providing a reservoir material containing Si or Ge; forming the absorber layer on the reservoir material, wherein the absorber layer comprises copper (Cu), zinc (Zn), tin (Sn), and at least one of sulfur (S) and selenium (Se); and annealing the reservoir material and the absorber layer under conditions sufficient to diffuse Si or Ge atoms from the reservoir material into the absorber layer with a concentration gradient to create band gap grading in the absorber layer.

In another aspect of the invention, a method of forming a photovoltaic device is provided. The method includes the steps of: providing a reservoir material containing Si or Ge on a substrate; forming an absorber layer on the reservoir material, wherein the absorber layer comprises Cu, Zn, Sn, and at least one of S and Se; annealing the reservoir material and the absorber layer under conditions sufficient to diffuse Si or Ge atoms from the reservoir material into the absorber layer with a concentration gradient to create band gap grading in the absorber layer; forming a buffer layer on the absorber layer; and forming a transparent front contact on the buffer layer.

In yet another aspect of the invention, a photovoltaic device is provided. The photovoltaic device includes: a substrate; an absorber layer on the substrate, wherein the absorber layer comprises Cu, Zn, Sn, and at least one of S and Se, and wherein the absorber layer further comprises a concentration gradient of Si or Ge atoms to create band gap grading in the absorber layer; a buffer layer on the absorber layer; and a transparent front contact on the buffer layer.

A more complete understanding of the present invention, as well as further features and advantages of the present invention, will be obtained by reference to the following detailed description and drawings.

DETAILED DESCRIPTION OF PREFERRED EMBODIMENTS

As highlighted above, to date insufficient processes exist for creating band gap grading in a CZTS/Se absorber material. The term "CZTS/Se" as used herein refers to a material containing copper (Cu), zinc (Zn), tin (Sn), and at least one of sulfur (S) and selenium (Se). Advantageously, provided herein are techniques for creating a CZTS/Se graded band gap material using a silicon (Si) or germanium (Ge) reservoir material and a controlled anneal to inter-diffuse Si or Ge (respectively) from the reservoir material into the CZTS/Se absorber creating a band gap gradient that peaks near the interface with the reservoir material. As will be described in detail below, the reservoir material can be provided as a film in contact with the CZTS/Se absorber and/or as a substrate on which the CZTS/Se material is formed. A detailed description of the present techniques is now provided by way of reference to FIGS. 1-5.

Figure 1:
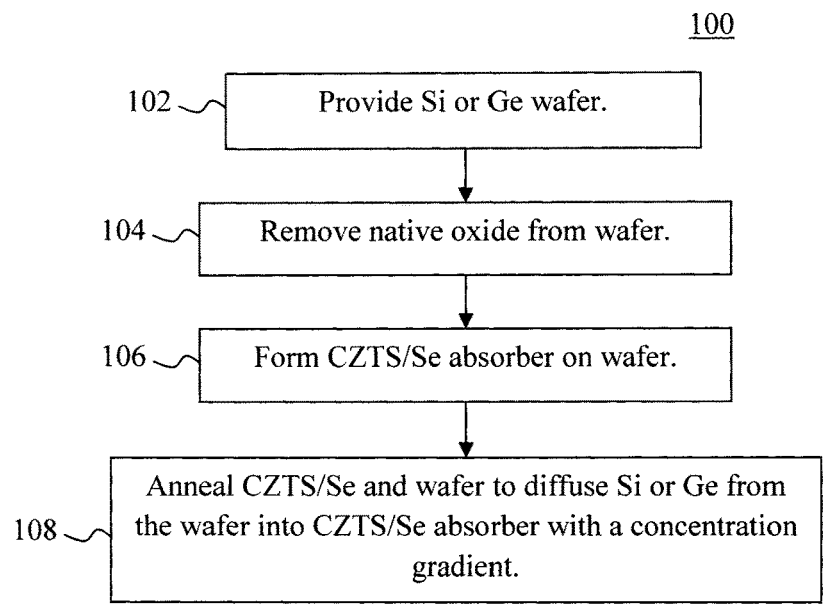
FIG. 1 is a diagram illustrating an exemplary methodology for creating band gap grading in an absorber layer using a wafer as a reservoir for Si or Ge atoms according to an embodiment of the present invention.
Figure 2:
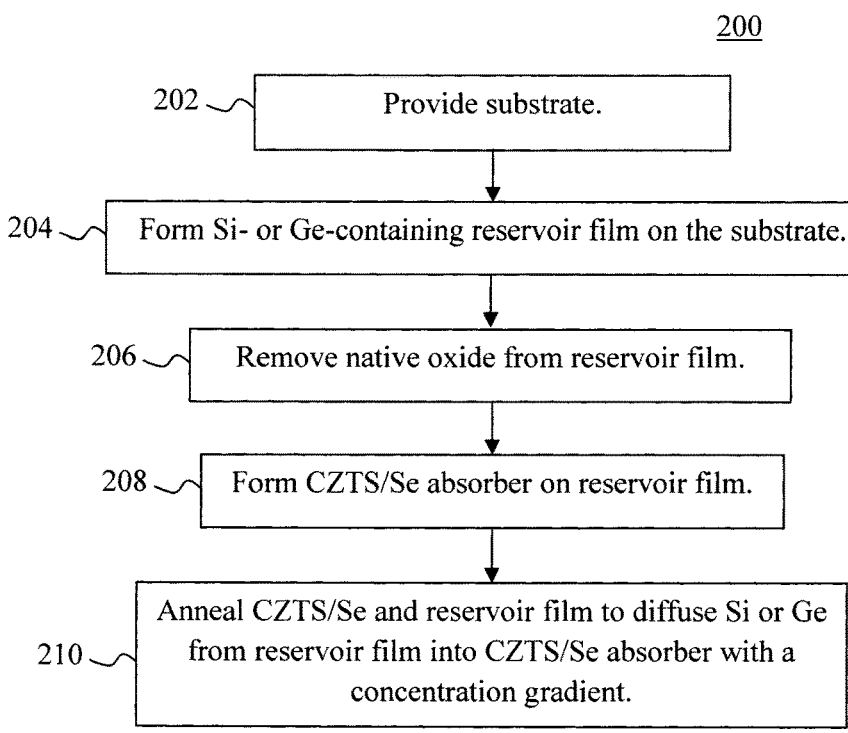
FIG. 2 is a diagram illustrating an exemplary methodology for creating band gap grading in an absorber layer using a Si- or Ge-containing film as the reservoir according to an embodiment of the present invention.

In a first exemplary embodiment described by way of reference to methodology 100 of FIG. 1, the reservoir material is provided as a wafer on which the CZTS/Se material is grown followed by a subsequent anneal to inter-diffuse Si or Ge from the wafer into the CZTS/Se absorber. Thus, in step 102 a Si or Ge-containing wafer is provided. By way of example only, the wafer can be a bulk semiconductor (e.g., a bulk Si or Ge wafer) or a semiconductor-on-insulator or SOI wafer. As is known in the art, an SOI wafer generally includes a SOI layer separated from a substrate by a buried insulator. In this example, the SOI layer would contain Si or Ge. When the SOI layer contains Si it is often referred to as a silicon-on-insulator wafer. The buried insulator can be an oxide material. When the buried insulator is an oxide material it is often referred to as a buried oxide or BOX.

The wafer in this case will serve as a reservoir for Si or Ge dopant species that will diffuse (via an annealing process) from the wafer into the CZTS/Se material (to be formed on the wafer). Thus, in step 104 a surface cleaning of the wafer is performed. Namely, when exposed to air, native oxides can form on the exposed surfaces of a semiconductor wafer (e.g., a layer of silicon dioxide ($SiO_2$) can form on a Si wafer). These native oxides can act as a barrier to the present diffusion process, and thus it is preferable to remove them. A suitable surface preparation for removing native oxides from the wafer includes, but is not limited to, a dip in (e.g., about 10%-80%) hydrofluoric (HF) acid.

In step 106, a CZTS/Se absorber is then formed on the cleaned wafer. According to an exemplary embodiment, the CZTS/Se absorber is grown on the wafer using an evaporation process to a thickness of from about 500 nanometers (nm) to about 2 micrometers (µm), and ranges therebetween. A suitable CZTS/Se evaporation process is described in Shin et al., "Epitaxial growth of kesterite $Cu_2ZnSnS_4$ on a Si(001) substrate by thermal coevaporation," Thin Solid Films, vol. 556, pgs. 9-12 (April 2014) (hereinafter "Shin"), the contents of which are incorporated by reference as if fully set forth herein. Depending on the growth temperature, evaporation can be used to produce epitaxial (see, for example, Shin) or polycrystalline CZTS/Se films (see, for example, Rockett "The effect of Na in polycrystalline and epitaxial single-crystal $CuIn_{1-x}Ga_xSe_2$," Thin Solid Films 480-481, pgs. 2-7 (2005) (published December 2004), the contents of which are incorporated by reference as if fully set forth herein. CZTS/Se evaporation involves only moderate temperatures, e.g., from about 150° C. to about 500° C., and ranges therebetween). The higher temperatures in that range are, however, needed for epitaxial growth. See, for example, Shin which describes the formation of epitaxial CZTS at temperatures of greater than or equal to 370° C. The atoms need to have enough kinetic energy to find the "lowest-energy-position" which would then allow for epitaxial growth.

Epitaxial growth occurs when a crystalline material (i.e., in this case crystalline CZTS/Se) is formed on a crystalline substrate (i.e., in this case a crystalline Si or Ge wafer) such that the atomic planes in the growing film are templated by the atomic planes in the substrate and have perfect atomic registry. The atomic planes in the growing film are thus oriented in the same direction as those in the substrate. Polycrystalline materials, on the other hand, have a random or non-ordered crystal structure which is not correlated with the underlying wafer.

In step 108, the Si or Ge reservoir (in this case the wafer) and the CZTS/Se film are annealed under conditions sufficient to diffuse (Si or Ge) dopant species from the wafer into the CZTS/Se forming a gradient of the dopant species in the CZTS/Se. By a "gradient" it is meant that a greatest concentration of the dopant species will be in a region of the CZTS/Se absorber adjacent to the reservoir material (i.e., the wafer) and the concentration of dopant species in the CZTS/Se absorber will decrease as one moves farther away from the reservoir material. This concentration gradient is what results in the band gap grading desirably achieved in the CZTS/Se absorber via the present process. Namely, as provided above, the replacement of Cu, Zn, and/or Sn atoms with iso-valent species having different atomic/ionic radii (such as Si or Ge replacing Sn), changes the band gap of the material. The CZTS/Se band gap increases (nearly linearly) with an increase in the concentration of the Si or Ge dopant species. See, for example, Shu. Thus, since the concentration of the dopant species (Si or Ge) by way of the present process is graded throughout the CZTS/Se, the band gap likewise will be graded throughout the CZTS/Se with a highest band gap occurring in the region of the CZTS/Se adjacent to the reservoir/wafer.

According to an exemplary embodiment, the conditions include, but are not limited to, annealing the wafer and CZTS/Se at a temperature of from about 500° C. to about 650° C., and ranges therebetween, for a duration of from about 30 seconds to about 10 minutes, and ranges therebetween, in an excess-chalcogen environment. The temperature and/or duration of the anneal can be used to control the gradient. For instance, increasing the temperature and/or the duration will increase the extent of diffusion of the dopant species. For instance, increasing the temperature will increase the kinetic energy of the Si or Ge atoms and thus their rate of diffusion into the CZTS/Se absorber material.

As a result, a greater spreading of the dopant species throughout the CZTS/Se absorber material will occur. A greater spreading of the dopant species throughout the CZTS/Se absorber material will change the concentration gradient of the Si or Ge atoms. To use a simple example, prior to annealing, all of the Si or Ge atoms are present in the reservoir material. If one were to anneal at a (relatively) lower temperature such as 500° C., then some diffusion of the Si or Ge atoms into the CZTS/Se material will occur. However, for a given duration, the concentration of Si or Ge atoms in the CZTS/Se absorber away from the interface with the reservoir will be less than if the annealing was performed at a (relatively) higher temperature, such as 650° C., due to a greater rate of diffusion. In a similar manner, one could also regulate the amount of diffusion based on the duration. For instance, for a given temperature, increasing/decreasing the duration can increase/decrease the amount of diffusion.

As highlighted above, the greatest concentration of the Si or Ge atoms in the CZTS/Se absorber will be at the interface with the reservoir material. Based on the present process, the concentration of Si or Ge atoms in the CZTS/Se absorber will gradually decrease the farther one moves away from that interface, hence forming a concentration gradient. Accordingly, in the present example, the highest concentration of Si or Ge will be found in a region of the CZTS/Se absorber adjacent to the reservoir wafer, and the lowest concentration of Si or Ge will be found in a region of the CZTS/Se absorber farthest away from the reservoir wafer, with regions of varying Si or Ge concentration therebetween. Thus, one way to analyze the gradient is by comparing the Si or Ge atom concentration at two points in the CZTS/Se material, for instance one point p1 at the interface with the reservoir wafer and another point p2 at a distance d away from the reservoir wafer. The ratio of p1 to p2 is expected to decrease with an increase in annealing temperature and/or duration since increasing these parameters will increase the rate of diffusion of the Si or Ge atoms into the CZTS/Se, thereby increasing the concentration of the Si or Ge atoms within the CZTS/Se material relative to the concentration at the interface. The converse also holds, i.e., the ratio of p1 to p2 will increase as less diffusion is expected at lower temperatures and/or shorter annealing durations.

Another parameter that can be used to control the gradient is the CZTS/Se absorber layer thickness. Namely, for a given annealing temperature and duration, varying the thickness of the CZTS/Se material can change the distribution of the Si or Ge atoms that diffuse into the material. For instance, using the above example, a thicker CZTS/Se means a greater distance d that the Si or Ge atoms have to disperse throughout the material, and vice versa.

In the example above, the wafer serves as the reservoir for the Si or Ge atoms. The present techniques can, however, be employed using a reservoir film that is separate or distinct from the wafer. For instance, for some device configurations, it may be more convenient to form the CZTS/Se absorber on a substrate other than a Si or Ge wafer. In that case, a Si or Ge-containing film may be used as the reservoir material on which the CZTS/Se absorber is formed. See, for example, methodology 200 of FIG. 2.

In step 202, a substrate is provided. In this case, the substrate (unlike the wafer in the example above) does not serve as the reservoir for the Si or Ge atoms. By way of example only, the substrate might be a material or materials suitable for forming a photovoltaic device substrate, such as a metal or glass substrate optionally coated with a conductive layer.

In step 204, a Si- or Ge-containing reservoir film is formed on the substrate. According to an exemplary embodiment, the reservoir film is grown on the substrate using, e.g., an evaporation growth process to a thickness of from about 0.2 micrometers (μm) to about 3.0 μm, and ranges therebetween.

The CZTS/Se absorber material will then be grown on the reservoir film. If the reservoir film and the CZTS/Se are deposited in-situ (i.e., without breaking vacuum), then there is little chance of a native oxide forming on the reservoir film prior to CZTS/Se deposition. Thus in that case, a surface cleaning of the reservoir film may not be needed. However, as described in detail above, the presence of native oxide between the reservoir and the CZTS/Se can act as a barrier to diffusion of the Si or Ge atoms. Thus, if there is a chance that a native oxide is present at this interface, it is preferable to (in step 206) perform a surface cleaning of the reservoir film. As provided above, a suitable surface preparation includes a dip in HF acid.

In step 208, the CZTS/Se absorber is then formed on the reservoir film. In the same manner as described above, the CZTS/Se absorber may be formed using an evaporation process to a thickness of from about 500 nm to about 2 μm, and ranges therebetween. Depending on the conditions employed, the resulting CZTS/Se material is likely to be polycrystalline in this case (especially when a metal or glass substrate is being used). As noted above, the thickness of the CZTS/Se absorber layer can be regulated to control the diffusion of the Si or Ge atoms from the reservoir film (see step 210—described below). Namely, the thicker the CZTSe layer, the further the distance d into the CZTS/Se the Si or Ge atoms have to diffuse. Thus one can regulate the thickness of the CZTS/Se absorber to control the gradient.

In step 210, the reservoir film and the CZTS/Se absorber layer are annealed under conditions sufficient to diffuse Si or Ge atoms from the reservoir film into the CZTS/Se absorber with a concentration gradient. This concentration gradient creates band gap grading in the absorber layer. As provided above, suitable conditions for this anneal include, but are not limited to, a temperature of from about 500° C. to about 650° C., and ranges therebetween, and a duration of from about 30 seconds to about 10 minutes, and ranges therebetween.

As provided above, the annealing temperature and/or the duration can be regulated to control the gradient. For instance, an increase/decrease in the temperature and/or duration increases/decreases the spreading of the Si or Ge atoms throughout the CZTS/Se absorber layer. Thus one can tailor the temperature and/or duration (and/or CZTS/Se absorber layer thickness—see above) to alter the concentration gradient of Si or Ge atoms in the CZTS/Se absorber layer.

Figure 3:
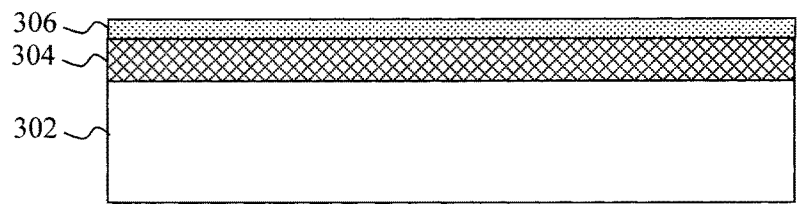
FIG. 3 is a cross-sectional diagram illustrating a starting platform for forming a photovoltaic device including a substrate, an optional conductive layer on the substrate, and a Si- or Ge-containing reservoir film on the substrate/conductive layer according to an embodiment of the present invention.
Figure 4:
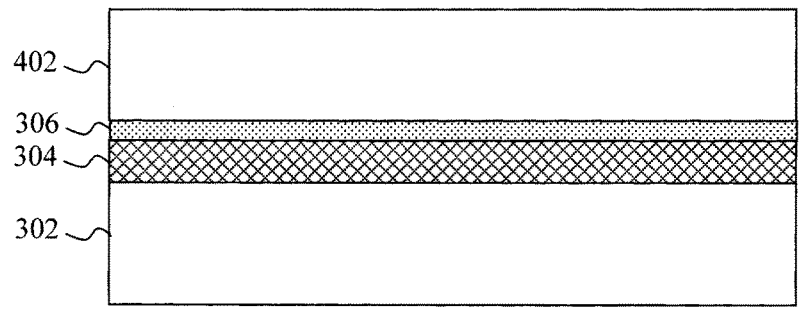
FIG. 4 is a cross-sectional diagram illustrating a CZTS/Se absorber layer having been formed on the reservoir film according to an embodiment of the present invention.

The present CZTS/Se with band gap grading can be used for a variety of different applications. For instance, in the example now being provided, the present techniques are incorporated into a process for forming a CZTS/Se-based photovoltaic device. In a first exemplary process flow (see FIGS. 3-6) a reservoir film is used to create band gap grading in the CZTS/Se absorber layer. As shown in FIG. 3, the process begins with a substrate 302. Suitable substrates include, but are not limited to, glass, ceramic, metal foil, or plastic substrates. When the substrate 302 is formed from a non-electrically conductive material, it may be preferable to further form an (electrically) conductive layer 304 on the substrate 302. See FIG. 3. The conductive layer 304 will serve as a bottom electrode of the photovoltaic device. Suitable materials for forming conductive layer 304 include, but are not limited to, molybdenum (Mo), nickel (Ni), tantalum (Ta), tungsten (W), aluminum (Al), platinum (Pt), titanium nitride (TiN), silicon nitride (SiN), and combinations including at least one of the foregoing materials (for example as an alloy of one or more of these metals or as a stack of multiple layers). According to an exemplary embodiment, the conductive layer 304 is formed on the substrate 302 using evaporation or sputtering to a thickness of from about 0.1 µm to about 3.0 µm, and ranges therebetween.

Next, a reservoir film 306 is grown on the substrate 302 (or on the conductive layer 304, if present) using, e.g., an evaporation or sputtering growth process to a thickness of from about 0.2 µm to about 3.0 µm, and ranges therebetween.

A CZTS/Se absorber layer 402 is then formed on the reservoir film 306. See FIG. 4. As provided above, an evaporation process may be used to form the CZTS/Se absorber layer 402. Depending on the conditions employed, the CZTS/Se can be polycrystalline or epitaxial.

Figure 5:
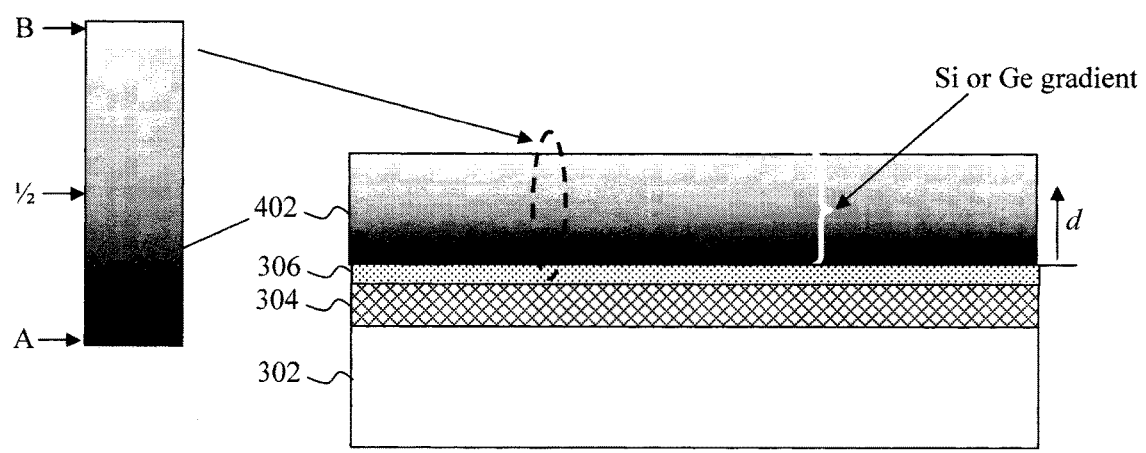
FIG. 5 is a cross-sectional diagram illustrating an anneal having been performed to diffuse Si or Ge atoms from the reservoir film into the CZTS/Se absorber layer with a concentration gradient to create band gap grading in the CZTS/Se absorber layer according to an embodiment of the present invention.
Figure 6:
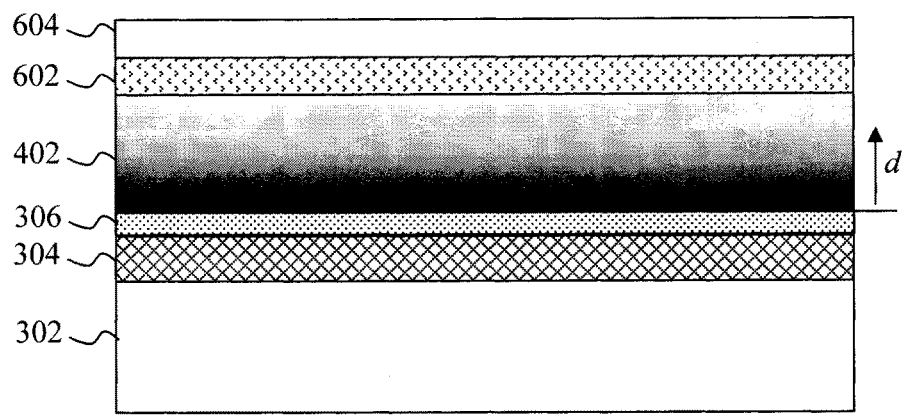
FIG. 6 is a cross-sectional diagram illustrating a buffer layer and transparent front contact having been formed on the CZTS/Se absorber layer according to an embodiment of the present invention.

Next, in the same manner as described above, an anneal is performed under conditions sufficient to diffuse Si or Ge atoms from the (cleaned) reservoir film into the CZTS/Se absorber layer 402 with a concentration gradient, thereby creating band gap grading in the CZTS/Se absorber layer 402. See FIG. 5. As shown in FIG. 5, the present process results in a higher concentration of Si or Ge atoms near the bottom of the CZTS/Se absorber layer 402 adjacent to the substrate 302, and which decreases with a distance d away from the substrate 302—thus forming a concentration gradient (as indicated by the shading gradient in FIG. 5).

An enlarged view of the CZTS/Se absorber layer is also provided in FIG. 5 to further illustrate the gradient achievable via the present techniques. According to an exemplary embodiment, Si or Ge atoms are added (with a concentration gradient) so that the back ½ the CZTS/Se absorber layer is graded up to a band gap value (i.e., at point A) which is from about 0.1 electron volts (eV) to about 0.4 eV, and ranges therebetween (e.g., about 0.2 eV), greater than the band gap value at the front of the film (i.e., at point B).

A buffer layer 602 is then formed on the CZTS/Se absorber layer 402. See FIG. 6. The buffer layer 602 and the CZTS/Se absorber layer 402 form a p-n junction therebetween. Suitable materials for forming the buffer layer 602 include, but are not limited to, cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material). According to an exemplary embodiment, the buffer layer 602 is formed using standard chemical bath techniques to a thickness of from about 50 angstroms (Å) to about 1,000 Å, and ranges therebetween.

A transparent front contact 604 is formed on the buffer layer 602. See FIG. 6. Suitable materials for forming the transparent front contact include, but are not limited to, a transparent conductive oxide (TCO) such as indium-tin-oxide (ITO) and/or aluminum (Al)-doped zinc oxide (ZnO) (AZO)). According to an exemplary embodiment, the transparent front contact 604 is formed on the buffer layer 602 using sputtering.

Figure 7:
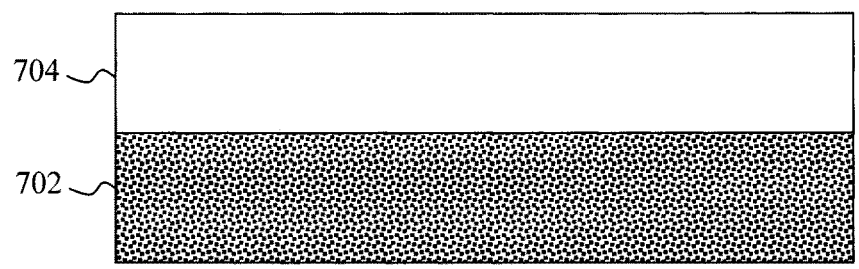
FIG. 7 is a cross-sectional diagram illustrating, according to an alternative embodiment, a starting platform for forming a photovoltaic device including a doped Si or Ge reservoir wafer, and a CZTS/Se absorber layer having been formed on the reservoir wafer according to an embodiment of the present invention.

In another exemplary process flow (see FIGS. 7-9) a reservoir wafer is used to create band gap grading in the CZTS/Se absorber layer. As shown in FIG. 7, the process begins with a doped Si or Ge wafer 702.

With the high conductivity of the doped wafer 702 for electrical transport, an additional substrate or intervening films wouldn't be needed. According to an exemplary embodiment, the wafer 702 is p-type doped which would make good Ohmic contact with the CZTS/Se. Suitable p-type dopants include, but are not limited to boron (B).

A CZTS/Se absorber layer 704 is then formed on the reservoir wafer 702. As provided above, an evaporation process may be used to form the CZTS/Se absorber layer 704. Depending on the conditions employed, the CZTS/Se can be polycrystalline or epitaxial.

Figure 8:
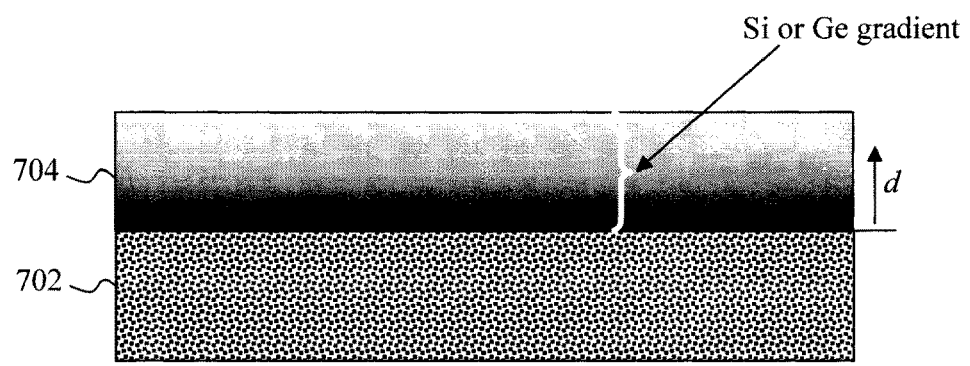
FIG. 8 is a cross-sectional diagram illustrating an anneal having been performed to diffuse Si or Ge atoms from the reservoir wafer into the CZTS/Se absorber layer with a concentration gradient to create band gap grading in the CZTS/Se absorber layer according to an embodiment of the present invention.
Figure 9:
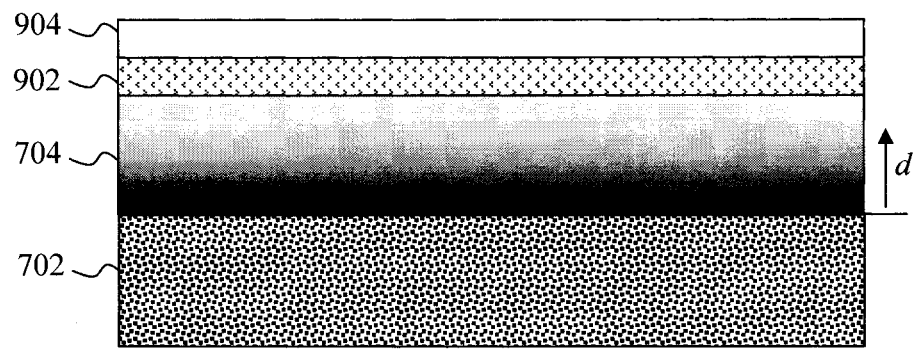
FIG. 9 is a cross-sectional diagram illustrating a buffer layer and transparent front contact having been formed on the CZTS/Se absorber layer according to an embodiment of the present invention.

Next, in the same manner as described above, an anneal is performed under conditions sufficient to diffuse Si or Ge atoms from the (cleaned) reservoir wafer into the CZTS/Se absorber layer 704 with a concentration gradient, thereby creating band gap grading in the CZTS/Se absorber layer 704. See FIG. 8. As shown in FIG. 8, the present process results in a higher concentration of Si or Ge atoms near the bottom of the CZTS/Se absorber layer 704 adjacent to the reservoir wafer 702, and which decreases with a distance d away from the reservoir wafer 702—thus forming a concentration gradient (as indicated by the shading gradient in FIG. 8).

A buffer layer 902 is then formed on the CZTS/Se absorber layer 704, and a transparent front contact 904 is formed on the buffer layer 902. See FIG. 9. Suitable buffer layer and transparent front contact materials were provided above.

Figure 10:
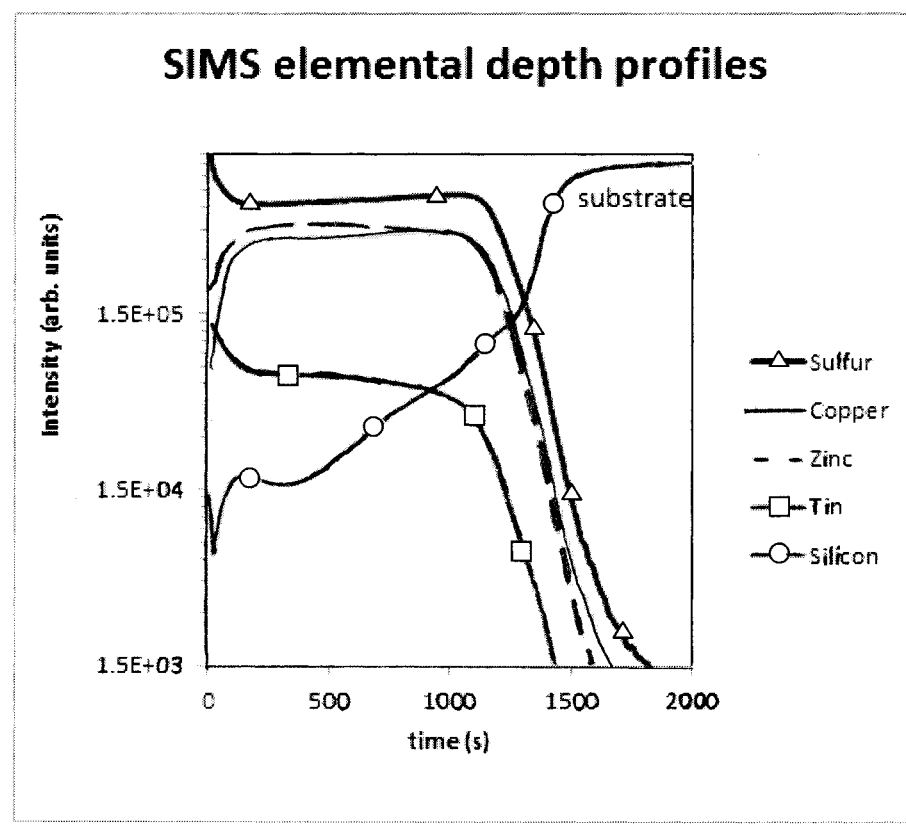
FIG. 10 is a diagram illustrating secondary ion mass spectrometry (SIMS) elemental depth profiles of a CZTS/Se absorber layer formed using the present techniques according to an embodiment of the present invention.

FIG. 10 is a diagram illustrating measured secondary ion mass spectrometry (SIMS) elemental depth profiles of a CZTS/Se absorber layer formed using the present techniques. As shown in FIG. 10, there is a silicon gradient in the absorber layer, while the rest of the traces are relatively flat.

Figure 11:
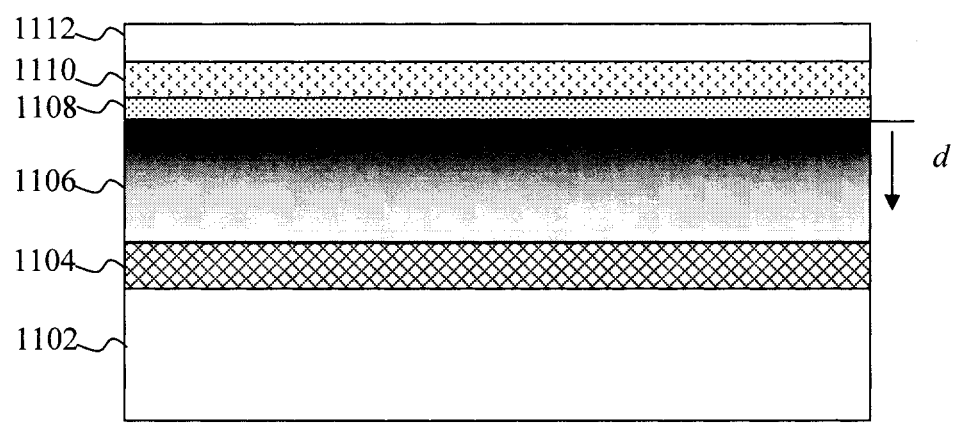
FIG. 11 is a diagram illustrating, according to an alternative embodiment, band gap grading from the front of the CZTS/Se absorber layer according to an embodiment of the present invention.

It is notable that while examples have been provided above where the band gap gradient created in the CZTS/Se absorber layer peaks at the "back end" of the material (i.e., the side of the CZTS/Se material adjacent to the substrate/conductive layer back contact) the present techniques may be applied in the same manner to creating a band gap gradient at the other side of the CZTS/Se material (i.e., a band gap gradient that peaks at the side of the CZTS/Se absorber layer adjacent to the p-n junction/buffer layer). Such an example is shown illustrated in FIG. 11. Like the example shown in FIGS. 3-6, the reservoir material in FIG. 11 is a Si or Ge containing film. However, in this case, the reservoir film is placed after the CZTS/Se absorber layer is formed. The diffusion anneal is then performed to form the band gap gradient from the front of the material. Specifically, as shown in FIG. 11 a conductive layer 1104 is formed on a substrate 1102, followed by a CZTS/Se absorber layer 1106. Each of these structures was described in detail above. A Si or Ge containing reservoir film 1108 is formed on the CZTS/Se absorber layer 1106 (i.e., on a side of the CZTS/Se absorber layer 1106 opposite the substrate 1102/conductive layer 1104). The above-described anneal is then performed to diffuse Si or Ge atoms from the reservoir film 1108 into the CZTS/Se absorber layer 1106 with a concentration gradient, to create a band gap gradient in the CZTS/Se absorber layer 1106. In this case however, as shown in FIG. 11, the present process results in a higher concentration of Si or Ge atoms near the top of the CZTS/Se absorber layer 1106 adjacent to the junction with a buffer layer 1110, and which decreases with a distance d away from the buffer layer 1110—thus forming a concentration gradient (as indicated by the shading gradient in FIG. 11). A transparent front contact 1112 is next formed on the buffer layer 1110.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for creating band gap grading in an absorber layer, the method comprising the steps of:
   growing a reservoir material containing silicon (Si) or germanium (Ge) on a substrate;
   forming the absorber layer on the reservoir material, wherein the absorber layer comprises copper (Cu), zinc (Zn), tin (Sn), and at least one of sulfur (S) and selenium (Se), and wherein the step of growing the reservoir material on the substrate and the step of forming the absorber layer on the reservoir material are both performed using an in-situ evaporation process without breaking vacuum between the steps of growing the reservoir material and forming the absorber layer such that native oxides are absent from an interface between the reservoir material and the absorber layer; and
   annealing the reservoir material and the absorber layer in a chalcogen-containing environment under conditions sufficient to diffuse Si or Ge atoms as a dopant species from the reservoir material into the absorber layer with a concentration gradient to create band gap grading in the absorber layer, wherein the concentration gradient comprises a concentration of the dopant species that peaks at a side of the absorber layer adjacent to the reservoir material and which is graded throughout the absorber layer as a function of a distance d away from the reservoir material, and wherein the annealing step further results in creating the absorber layer having a band gap value at a back of the absorber layer that is from about 0.1 eV to about 0.4 eV greater than a band gap value at a front of the absorber layer.

2. The method of claim 1, wherein the conditions comprise a temperature and a duration.

3. The method of claim 2, wherein the temperature is from about 500° C. to about 650° C.

4. The method of claim 2, wherein the duration is from about 30 seconds to about 10 minutes.

5. The method of claim 2, further comprising the step of:
   regulating at least one of the temperature and the duration to control the concentration gradient.

6. The method of claim 1, further comprising the step of:
   performing a surface cleaning of the reservoir material prior to forming the absorber layer on the reservoir material.

7. The method of claim 1, wherein the reservoir material is a Si-containing film, and wherein the annealing step is performed to diffuse Si atoms as the dopant species from the reservoir material into the absorber layer with the concentration gradient to create band gap grading in the absorber layer.

8. The method of claim 1, wherein the absorber layer has a thickness of from about 500 nm to about 2 μm.

9. The method of claim 8, further comprising the step of:
   regulating the thickness of the absorber layer to control the concentration gradient.

10. The method of claim 1, wherein at least a portion of the reservoir material remains on the substrate after the annealing step has been performed.

11. A method of forming a photovoltaic device, the method comprising the steps of:
    growing a reservoir material containing Si or Ge on a substrate;
    forming an absorber layer on the reservoir material, wherein the absorber layer comprises Cu, Zn, Sn, and at least one of S and Se, and wherein the step of growing the reservoir material on the substrate and the step of forming the absorber layer on the reservoir material are both performed using an in-situ evaporation process without breaking vacuum between the steps of growing the reservoir material and forming the absorber layer such that native oxides are absent from an interface between the reservoir material and the absorber layer;
    annealing the reservoir material and the absorber layer in a chalcogen-containing environment under conditions sufficient to diffuse Si or Ge atoms as a dopant species from the reservoir material into the absorber layer with a concentration gradient to create band gap grading in the absorber layer, wherein the concentration gradient comprises a concentration of the dopant species that peaks at a side of the absorber layer adjacent to the reservoir material and which is graded throughout the absorber layer as a function of a distance d away from the reservoir material, and wherein the annealing step further results in creating the absorber layer having a band gap value at a back of the absorber layer that is from about 0.1 eV to about 0.4 eV greater than a band gap value at a front of the absorber layer;
    forming a buffer layer on the absorber layer; and
    forming a transparent front contact on the buffer layer.

12. The method of claim 11, wherein the conditions comprise a temperature and a duration.

13. The method of claim 12, wherein the temperature is from about 500° C. to about 650° C.

14. The method of claim 12, wherein the duration is from about 30 seconds to about 10 minutes.

15. The method of claim 12, further comprising the step of:
    regulating at least one of the temperature and the duration to control the concentration gradient.

16. The method of claim 11, further comprising the step of:
    performing a surface cleaning of the reservoir material prior to forming the absorber layer on the reservoir material.

17. The method of claim 11, wherein the absorber layer has a thickness of from about 500 nm to about 2 μm.

18. The method of claim 17, further comprising the step of:
    regulating the thickness of the absorber layer to control the concentration gradient.

19. The method of claim 11, wherein
    the reservoir material is grown on the substrate to a thickness of from about 0.2 μm to about 3.0 μm.

* * * * *